United States Patent
Sung et al.

(10) Patent No.: US 8,163,579 B2
(45) Date of Patent: Apr. 24, 2012

(54) METHOD OF MANUFACTURING SUBSTRATE FOR FORMING DEVICE, AND METHOD OF MANUFACTURING NITRIDE-BASED SEMICONDUCTOR LASER DIODE

(75) Inventors: Youn Joon Sung, Gyeonggi-do (KR); Ho Sun Paek, Gyeonggi-do (KR)

(73) Assignee: Samsung LED Co., Ltd, Gyunggi-Do (KR)

( * ) Notice: Subject to any disclaimer, the term of this patent is extended or adjusted under 35 U.S.C. 154(b) by 0 days.

(21) Appl. No.: 12/073,293

(22) Filed: Mar. 4, 2008

(65) Prior Publication Data

US 2009/0155945 A1 Jun. 18, 2009

(30) Foreign Application Priority Data

Dec. 17, 2007 (KR) ........................ 10-2007-0132449

(51) Int. Cl.
*H01L 33/00* (2010.01)
(52) U.S. Cl. .................................. 438/33; 257/E33.003
(58) Field of Classification Search ................ 438/2, 33, 438/42; 257/E33.003, 594
See application file for complete search history.

(56) References Cited

U.S. PATENT DOCUMENTS

| | | | |
|---|---|---|---|
| 5,593,815 A * | 1/1997 | Ahn | 430/321 |
| 6,033,927 A * | 3/2000 | Shibata et al. | 438/33 |
| 6,294,475 B1 * | 9/2001 | Schubert et al. | 438/712 |
| 6,748,001 B1 * | 6/2004 | Nishitsuka et al. | 372/43.01 |
| 2001/0048114 A1 | 12/2001 | Morita et al. | |
| 2002/0197830 A1 * | 12/2002 | Watanabe et al. | 438/492 |
| 2003/0198837 A1 * | 10/2003 | Craven et al. | 428/698 |
| 2004/0238810 A1 | 12/2004 | Dwilinski et al. | |
| 2005/0003632 A1 * | 1/2005 | Onishi et al. | 438/462 |
| 2005/0247260 A1 | 11/2005 | Shin et al. | |
| 2005/0277212 A1 * | 12/2005 | Kamikawa | 438/21 |
| 2007/0254459 A1 | 11/2007 | Lee et al. | |
| 2009/0079034 A1 * | 3/2009 | Wang | 257/615 |
| 2010/0219419 A1 * | 9/2010 | Hata et al. | 257/79 |

FOREIGN PATENT DOCUMENTS

| | | |
|---|---|---|
| JP | 10-335750 A | 12/1998 |
| JP | 11-004048 A | 1/1999 |
| JP | 11004048 A * | 1/1999 |
| JP | 2007-243006 | 9/2007 |
| JP | 2007-290960 | 11/2007 |
| KR | 10-2004-0047968 A | 6/2004 |
| KR | 10-2006-0045834 A | 5/2006 |
| KR | 1020070042766 A | 4/2007 |

(Continued)

OTHER PUBLICATIONS

Machine translation of JP-11-004048 Sugimoto et al.*

(Continued)

*Primary Examiner* — Hsien Ming Lee
*Assistant Examiner* — Michele Fan
(74) *Attorney, Agent, or Firm* — McDermott Will & Emery LLP

(57) ABSTRACT

Provided is a method of manufacturing a semiconductor laser diode. The method includes the steps of: preparing a GaN substrate having an a-plane or m-plane GaN layer formed thereon; forming a plurality of laser diode structures on the GaN layer; etching the GaN substrate such that a cutting reference line is formed in a groove shape along the crystal surface of the a-plane or m-plane, not a main plane; and cutting the GaN substrate along the cutting reference line so as to form a mirror surface of the semiconductor laser diode, the mirror surface coinciding with the crystal surface of the a-plane or m-plane, not the main plane.

8 Claims, 5 Drawing Sheets

FOREIGN PATENT DOCUMENTS

WO     WO 2006/130623 A2     12/2006
WO     WO 2008018482 A1 *     2/2008

OTHER PUBLICATIONS

Korean Intellectual Property Office, Retrieved English/Computer Translation of Document dated Nov. 1, 2010 and Amendments dated Aug. 2, 2010.*

Korean Office Action, w/ English translation thereof, issued in Korean Patent Application No. KR 10-2007-0132449 dated May 31, 2010.

Japanese Office Action, w/ English translation thereof, issued in Japanese Patent Application No. JP 2008-048559 dated Jun. 14, 2011.

* cited by examiner

[FIG. 1A]
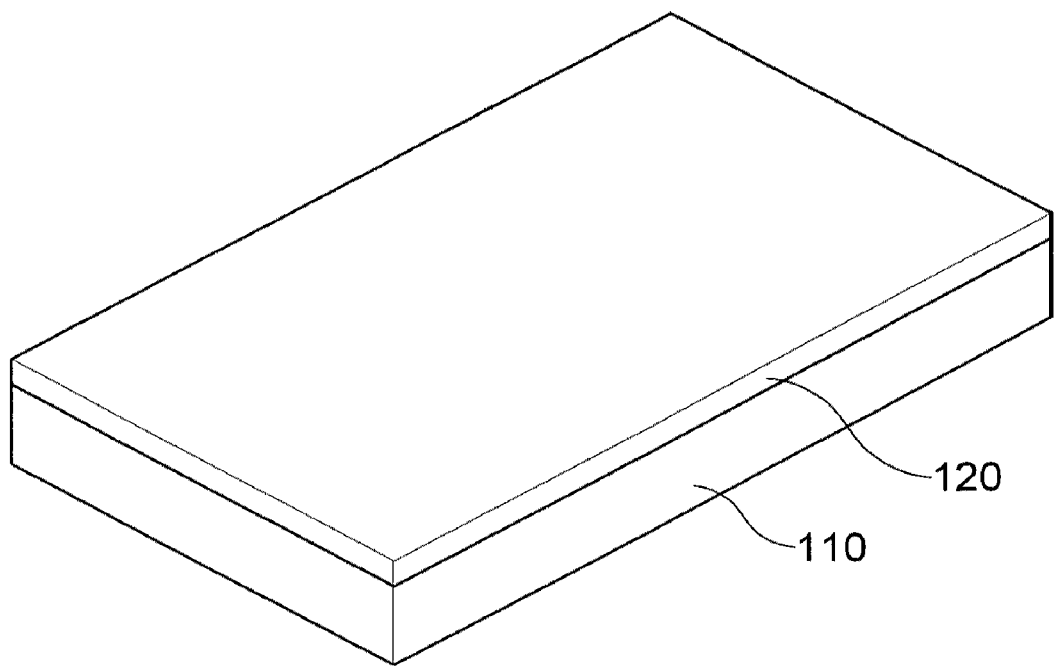
[FIG. 1B]
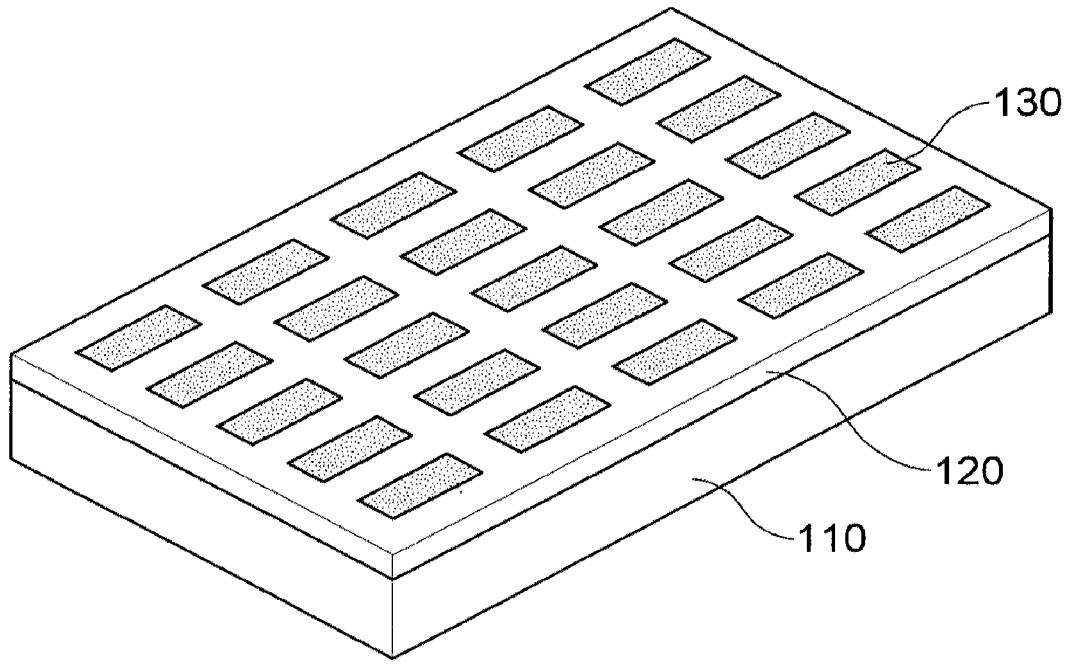

[FIG. 1C]
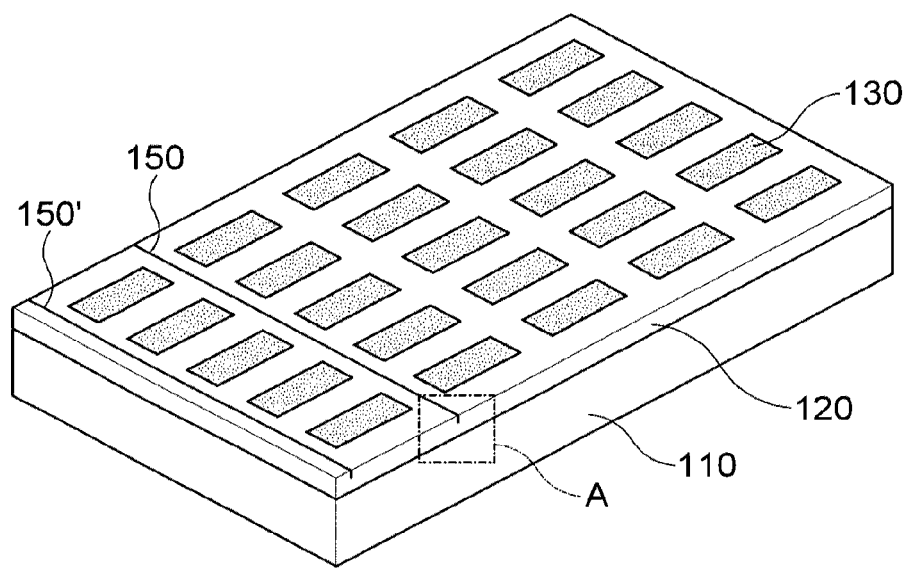
[FIG. 1D]
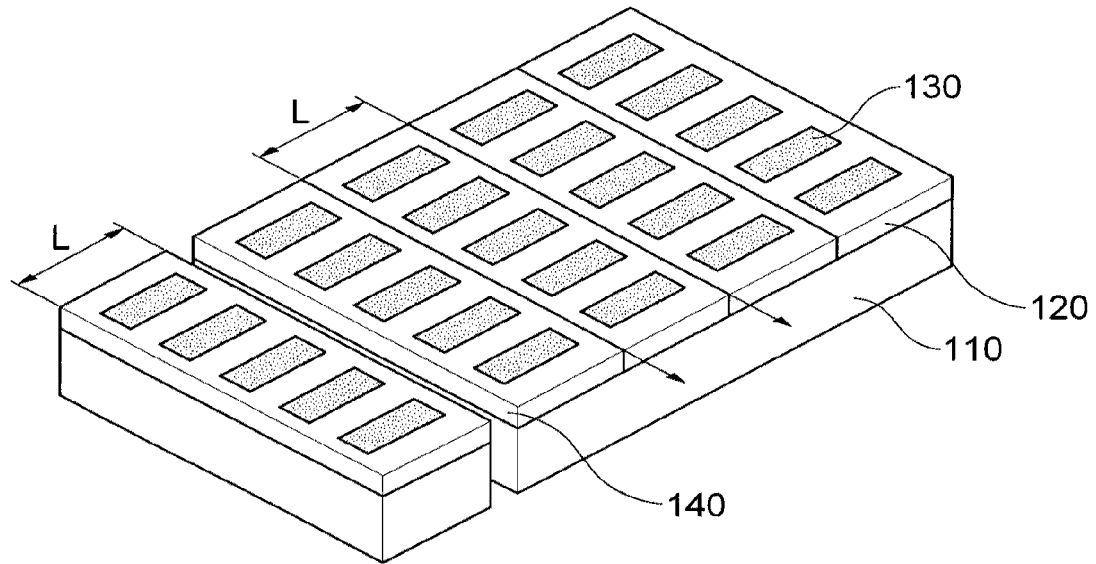

[FIG. 1E]
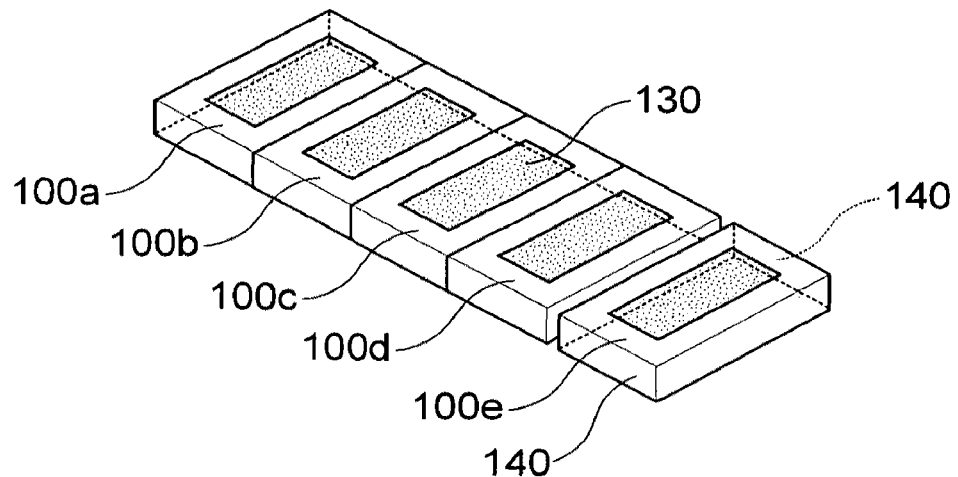
[FIG. 2A]
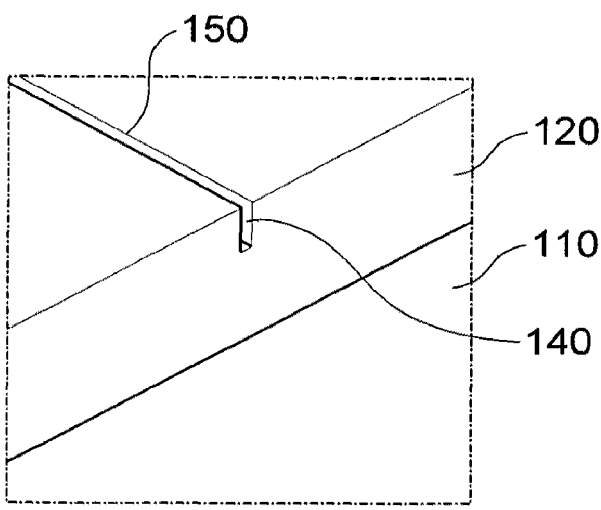
[FIG. 2B]
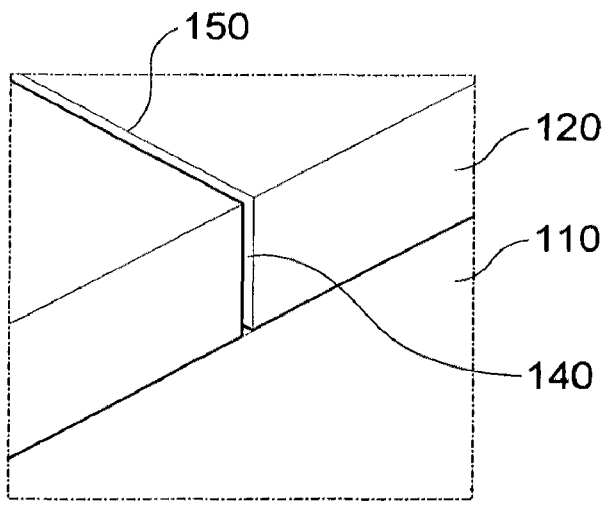

[FIG. 3A]
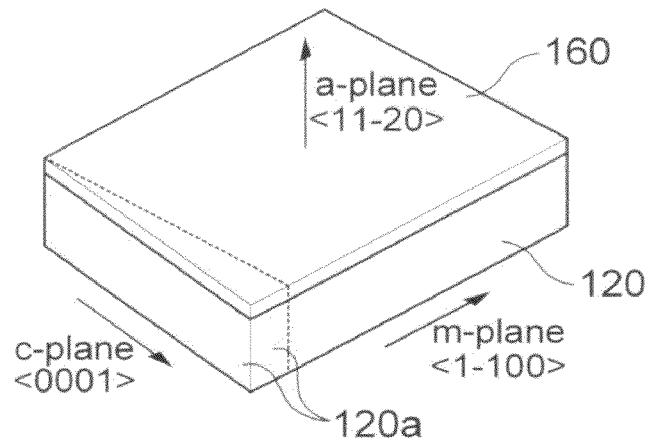
[FIG. 3B]
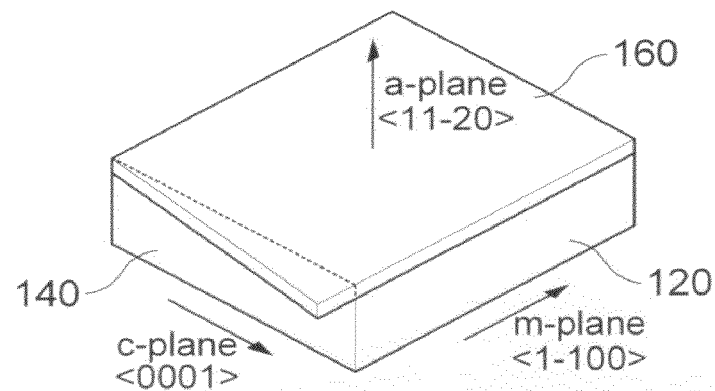
[FIG. 4A]
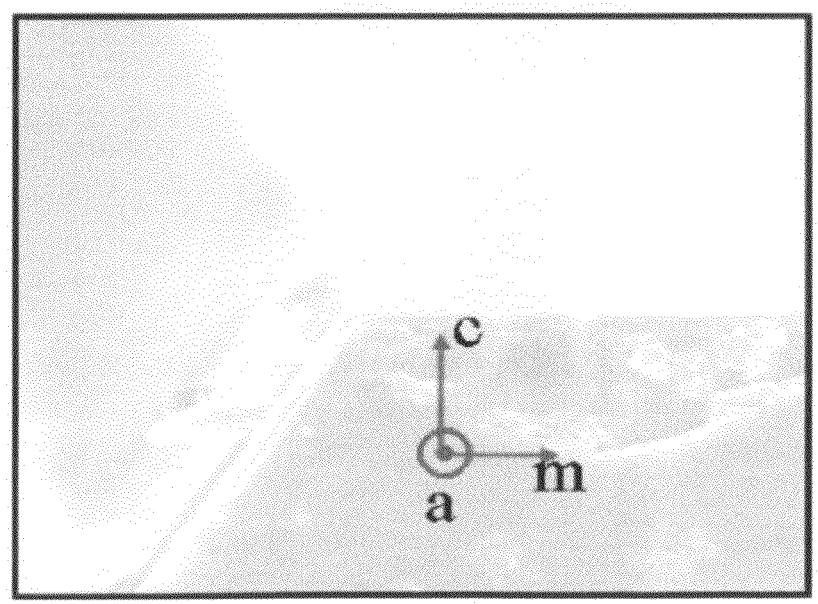

[FIG. 4B]
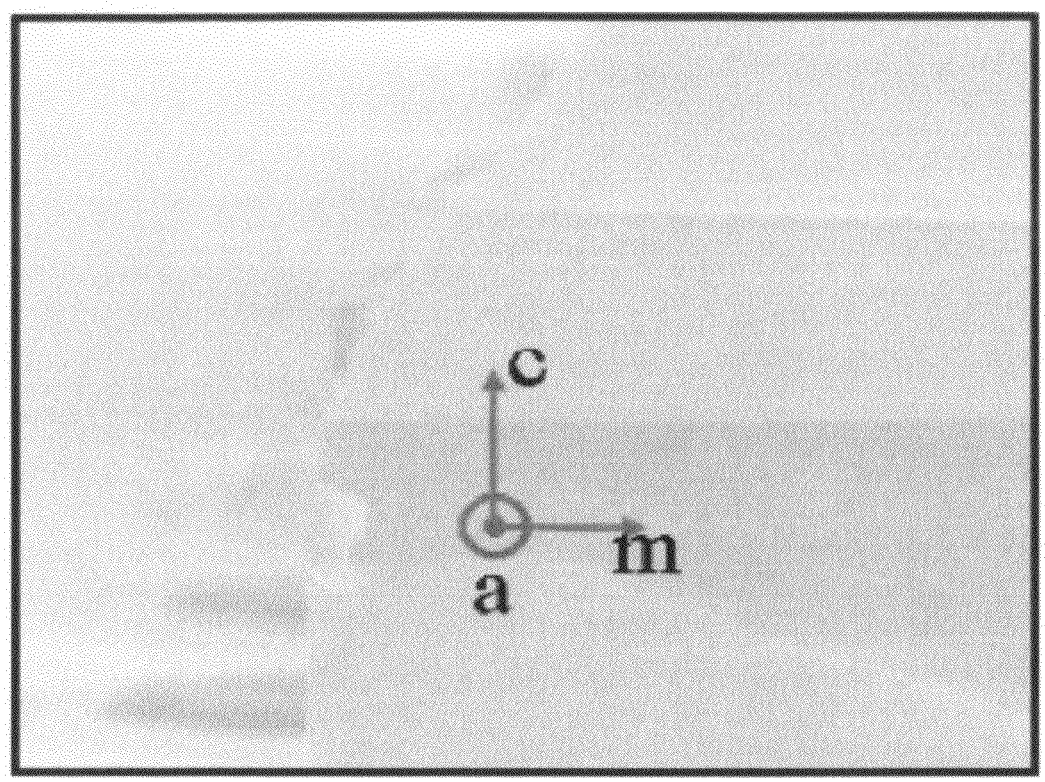

METHOD OF MANUFACTURING SUBSTRATE FOR FORMING DEVICE, AND METHOD OF MANUFACTURING NITRIDE-BASED SEMICONDUCTOR LASER DIODE

CROSS-REFERENCE TO RELATED APPLICATIONS

This application claims the benefit of Korean Patent Application No. 10-2007-0132449 filed with the Korea Intellectual Property Office on Dec. 17, 2007, the disclosure of which is incorporated herein by reference.

BACKGROUND OF THE INVENTION

1. Field of the Invention

The present invention relates to a method of manufacturing a substrate for forming a device, and a method of manufacturing nitride-based semiconductor laser diode.

2. Description of the Related Art

In a semiconductor laser diode with an edge-emission structure, light generated by recombination of carriers in an active layer is resonated by a mirror surface formed in a side surface of the semiconductor laser diode and is then lased.

In general, a single-crystal cleavage surface of a substrate and an epitaxial layer is used as the mirror surface. The characteristics of the mirror surface, such as roughness, angle and so on, have an effect upon the threshold current and reliability of the semiconductor laser diode.

In GaAs-based, Si-based, and InP-based semiconductor laser diodes using a homogeneous substrate of which the crystal surface coincides with the crystal surface of the epitaxial layer, a high-quality natural cleavage surface can be obtained by edge scribing and breaking.

However, when a heterogeneous substrate of which the crystal surface does not coincide with the crystal surface of the epitaxial layer is used, there are difficulties in forming the natural cleavage surface. In particular, when a GaN-based epitaxial layer is laminated on the sapphire substrate, the sapphire substrate and the crystal surface of the GaN-based epitaxial layer are grown so as to deviate from each other by 30 degrees. Therefore, it is hard to form the cleavage surface by using a general method.

That is, the formation of the mirror surface which does not coincide with the crystal direction increases the roughness of the cleavage surface such that an operational current of the device increases. When a notching and cleaving process for forming the mirror surface is applied, the cleavage surface eats into patterns. Then, a yield is reduced.

Meanwhile, a conventional nitride-based semiconductor laser diode is implemented on a c-plane GaN substrate. However, the c-plane of GaN crystal is known as a polar plane. Therefore, built-in electric fields generated by the polarization of the c-plane may have an adverse effect upon the combination of electrons and holes. As a result, the light emission efficiency of the laser diode may be reduced.

SUMMARY OF THE INVENTION

An advantage of the present invention is that it provides a method of manufacturing a nitride-based semiconductor laser diode in which semiconductor laser diode structures are formed on an a-plane or m-plane GaN substrate with no polarity, and a cleavage surface (mirror surface) is formed along a crystal surface by wet etching such that the roughness of the cleavage can be reduced.

Another advantage of the invention is that it provides a method of manufacturing a substrate for forming a device, in which wet etching is applied to an a-plane or m-plane GaN substrate with no polarity, thereby obtaining a crystallographic surface.

Additional aspect and advantages of the present general inventive concept will be set forth in part in the description which follows and, in part, will be obvious from the description, or may be learned by practice of the general inventive concept.

According to an aspect of the invention, a method of manufacturing a substrate for forming a device comprises the steps of: preparing a GaN substrate of which the a-plane or m-plane is set to a main plane; masking the main plane of the GaN substrate; and applying the masked GaN substrate to etching liquid, thereby forming a crystallographic surface.

Preferably, KOH is used as the etching liquid.

According to another aspect of the invention, a method of manufacturing a semiconductor laser diode comprises the steps of: preparing a GaN substrate having an a-plane or m-plane GaN layer formed thereon; forming a plurality of laser diode structures on the GaN layer; etching the GaN substrate such that a cutting reference line is formed in a groove shape along the crystal surface of the a-plane or m-plane, not a main plane; and cutting the GaN substrate along the cutting reference line so as to form a mirror surface of the semiconductor laser diode, the mirror surface coinciding with the crystal surface of the a-plane or m-plane, not the main plane.

Preferably, the preparing of the GaN substrate includes the steps of: preparing an r-plane sapphire substrate; and forming an a-plane or m-plane GaN layer on the r-plane sapphire substrate.

Preferably, the etching of the GaN substrate includes the steps of: applying a mask onto the GaN substrate having laser diode structures formed thereon such that a region where the cutting reference line is to be formed is exposed; and wet-etching the GaN substrate exposed through the mask such that the GaN substrate is etched along the crystal surface of a c-plane <0001>.

Preferably, the wet etching is performed using KOH etching liquid.

Preferably, the cutting reference line is formed by etching only portion of the GaN substrate in the thickness direction of the GaN substrate. Alternately, the cutting reference line is formed by etching the GaN substrate such that the sapphire substrate is exposed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1A to 1E are process diagrams showing a method of manufacturing a nitride-based semiconductor diode according to the invention;

FIGS. 2A and 2B are expanded view of a region A of FIG. 1C;

FIGS. 3A and 3B are diagrams for explaining an etching principle of a GaN substrate according to the invention; and FIGS. 4A and 4B are SEM (Scanning Electron Microscopy) photographs showing a state before and after the GaN substrate is applied to KOH etching liquid.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a method of manufacturing a substrate for forming a device and a nitride-based semiconductor diode according to the present invention will be described in detail with reference to the accompanying drawings.

FIGS. 1A to 1E are process diagrams showing a method of manufacturing a nitride-based semiconductor diode according to the invention.

As shown in FIG. 1A, an r-plane sapphire substrate 110 is prepared, and a GaN substrate 120 is then formed on the r-plane sapphire substrate 110. At this time, the GaN substrate 120 formed on the r-plane sapphire substrate 110 has an a-plane <11-20> or an m-plane <1-100> set to a main plane.

That is, when an a-plane <11-20> GaN substrate 120 is formed, the cut planes thereof are set to the a-plane <11-20> and the m-plane <1-100>. Further, when an m-plane <11-20> GaN substrate 120 is formed, the cut planes thereof are set to the a-plane <11-20> and the c-plane <0001>.

As such, after the a-plane <11-20> or m-plane <1-100> GaN substrate 120 is formed on the r-plane sapphire substrate 110, a plurality of semiconductor laser diode structures 130 are formed on the GaN substrate 120, as shown in FIG. 1B. Each of the semiconductor laser diode structures 130 is formed by laminating GaN-based semiconductor layers.

Since the semiconductor laser diode structure 130 is formed on the a-plane <11-20> or m-plane <1-100> GaN substrate 120, the semiconductor laser diode structure 130 is grown along the crystal direction of the GaN substrate 120 in the direction of the a-plane 11-20 or the m-plane 1-100.

That is, when the GaN substrate is the a-plane <11-20> GaN substrate, the semiconductor laser diode structures 130 are formed with the a-plane <11-20> set to the main plane. When the GaN substrate 120 is the m-plane <1-100> GaN substrate, the semiconductor laser diode structures 130 are formed with the m-plane <1-100> set to the main plane.

As such, since the semiconductor laser diode structures 130 are formed on the non-polar surface (the a-plane <11-20> or the m-plane <1-100>) along the crystal direction of the GaN substrate 120, built-in electric fields are prevented from occurring, which makes it possible to enhance light emission efficiency.

In the conventional nitride-based semiconductor laser diode, the GaN-based semiconductor layer grown along the direction of the polar c-plane is used. Therefore, built-in electric fields are generated along the direction of the c-plane by strong piezoelectricity and spontaneous polarization. The built-in electric fields spatially separate electrons and holes, thereby limiting carrier recombination efficiency and causing red shift emission.

In the invention, however, since the light emitting structure is formed on the non-polar surface (the a-plane 11-20 or the m-plane 1-100), the spontaneous and piezoelectric polarization is removed. Therefore, the recombination efficiency between electrons and holes is enhanced, thereby enhancing light emission efficiency and preventing the red shift emission.

Continuously, as shown in FIG. 1C, a cutting reference line 150 is formed on the GaN substrate 102 having the semiconductor laser diode structures 130 formed thereon, in a direction parallel to a direction where a mirror surface of the semiconductor laser diode is to be formed.

Meanwhile, before the cutting reference line 150 is formed, a grinding process such as lapping or polishing may be performed on the rear surface of the sapphire substrate 110, where the semiconductor laser diode structures 130 are not formed, to reduce the thickness of the sapphire substrate 110.

The cutting reference line 150 may be formed in a groove shape by removing portion of the GaN substrate 120.

FIGS. 2A and 2B are expanded view of a region A of FIG. 1C. As shown in the drawings, the cutting reference line 150 is formed in a groove shape by etching portion of the GaN substrate 120.

In this case, as shown in FIG. 2A, the cutting reference line 150 may be formed at a predetermined depth from the top surface of the GaN substrate 120. Alternately, as shown in FIG. 2B, the cutting reference line 150 may be formed at such a depth that the sapphire substrate 110 is exposed.

Further, a cleavage surface 140 of the GaN substrate 120, which is exposed by forming the cutting reference line, is set to a mirror surface. The cleavage surface 140 coincides with the crystal direction of the a-plane or m-plane GaN substrate 120.

As such, the formation of the cleavage surface 140 which coincides with the crystal direction of the a-plane or m-plane GaN substrate 120 will be described below in more detail.

As described above, FIGS. 2A and 2B show that the cutting reference line is formed by removing portion of the GaN substrate. Substantially, however, a plurality of GaN-based semiconductor layers for forming the semiconductor laser diode structures are laminated on the GaN substrate 120 where the cutting reference line 150 is formed.

Therefore, the semiconductor layers laminated for forming the semiconductor laser diode structures are substantially etched so as to form the cutting reference line 150. When the substrate is cut along the cutting reference line 150, the cut cleavage surface is set to the mirror surface.

In the invention, however, since the semiconductor laser diode structures are formed of GaN-based semiconductor layers, the semiconductor layers laminated for forming the semiconductor laser diode structures are unified as the GaN substrate 120, for convenience of description.

Subsequently, the semiconductor laser diode structures 130 are masked, and then the cutting reference line 150 is formed by wet etching.

That is, a mask exposing a region where the cutting reference line 150 is to be formed is prepared and applied onto the GaN substrate 120 having the semiconductor laser diode structures 130 formed thereon. Then, the cutting reference line 150 can be formed by the wet etching.

At this time, the c-plane of the GaN substrate 120 is not etched by etching liquid, and the etching is performed in only the a-plane and m-plane directions. Therefore, the etching is naturally performed in such a manner that the a-plane or m-plane, not the main plane, is aligned with the crystal surface of the c-plane. Accordingly, after the etching is completed, the cut plane of the GaN substrate coincides with the crystal surface of the c-plane.

Referring to FIGS. 3A and 3B, the principle where the GaN substrate is etched will be described in more detail.

As shown in FIG. 3A, the mask 160 is applied onto the GaN substrate 120 where the c-plane and the m-plane are set to the cut planes and the a-plane is set to the main plane. Then, when etching liquid is applied to the GaN substrate 120, the etching is performed in the a-plane and m-plane directions, but is not performed in the c-plane direction.

Therefore, when the etching liquid is applied to the GaN substrate 120 in a state where the entire surface or a predetermined region of the a-plane GaN substrate is protected, the etching is not performed on the c-plane, but is performed on the m-plane. Accordingly, while the etching is performed in the m-plane direction, the a-plane or m-plane direction of the GaN substrate 120 becomes crystallographically constant.

That is, a GaN substrate region 120a distorted from the crystal direction of the c-plane is all removed. After the etching is completed, the GaN substrate 120 of which the cut planes (the a-plane or m-plane and the c-plane) have a crystallographic surface is formed, as shown in FIG. 3B.

At this time, KOH may be used as the etching liquid.

Meanwhile, even when the m-plane is set to the main plane, the m-plane GaN substrate is masked and is then applied to KOH etching liquid. Then, since the etching is performed in the a-plane direction but is not performed in the c-plane direction, it is possible to manufacture a GaN substrate of which the a-plane or m-plane, not the main plane, and the c-plane have a constant crystal direction, as shown in FIG. 3B.

In the present invention, the crystal surface of the m-plane (a-plane) and the c-plane is formed as a cleavage surface by using a difference in etching rate between the c-plane and the m-plane (a-plane), as described above.

FIGS. 4A and 4B are SEM (Scanning Electron Microscopy) photographs showing a state before and after the GaN substrate is applied to KOH etching liquid. Since the etching is performed in only the a-plane and the m-plane directions but is not performed in the c-plane direction, the roughness of the a-plane and the m-plane is reduced, because the a-plane and the m-plane have a crystallographic surface.

After the reference cutting line 150 is formed by the wet etching, the substrates 110 and 120 are cut along the cutting reference line 150 by a mechanical method to form a mirror surface 140 on the cleavage surface, as shown in FIG. 1D. That is, the cut surface of the substrates forms the mirror surface 140. Since the mirror surface 140 has a crystal surface coinciding with the crystal direction of the a-plane or m-plane, not the main plane, the roughness of the surface approaches zero.

Continuously, the substrate 110 and 120 are cut in a direction parallel to the direction, where the mirror surface 140 of the semiconductor laser diode is to be formed, at every predetermined distance such that the same width as the resonance width L of the cut semiconductor laser diode is provided.

Meanwhile, a cutting reference line 150' may be formed on the outermost edge of the GaN substrate 120 where the laser diode structures 130 are formed. The GaN substrate 120 may be cut so as to be spaced at the resonance width L of the semiconductor laser diode from the cutting reference line 150'.

Then, as shown in FIG. 1E, the GaN substrate 120 is cut in a direction perpendicular to the mirror surface 140 of the semiconductor laser diode such that separate semiconductor laser diodes 100a to 100e are formed.

According to the invention, when the semiconductor laser diode using the GaN substrate of which the a-plane or m-plane is set to the main plane is manufactured, the crystal surface of the a-plane or m-plane, not the main plane, is formed as the cleavage surface by using a difference in etching rate between the c-plane and the a-plane (m-plane). Therefore, the roughness of the mirror surface of the semiconductor laser diode, which is formed as the cleavage surface, is reduced.

As the roughness of the mirror surface is reduced, the yield of the light extraction surface can be enhanced, an operation current can be reduced, and the light efficiency can be enhanced.

Since the light emitting diode (laser diode) is formed on the non-polar surface, the built-in electric fields can be prevented from occurring, and the light emission efficiency can be further enhanced.

The basic concept of the invention is that the cutting reference line coinciding with the crystal surface of the a-plane or m-plane, not the main plane, and the c-plane is formed by wet-etching the GaN substrate of which the a-plane or m-plane is set to the main surface. The cutting reference line is not applied only to the forming of the mirror surface of the semiconductor laser diode, but the GaN substrate having a crystallographic surface can be formed.

That is, the main surface of the GaN substrate, of which the a-surface or m-surface is set to the main surface, is masked and applied to the etching liquid. Therefore, it is possible to manufacture a substrate having a crystallographic surface.

As such, the GaN substrate having a crystallographic surface can be manufactured in such a manner that the diode pattern can be aligned with the accurate crystallographic direction. Therefore, the cleavage surface with a high quality can be obtained, which makes it possible to reduce an operational current. Further, the cutting reference line for dividing the substrate into devices can be formed in an accurate position such that the overall yield of diodes can be enhanced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a substrate for forming a device, the method comprising:
    preparing a GaN substrate of which an a-plane or an m-plane is selected as a main plane;
    masking the entirety of a surface of the main plane of the GaN substrate; and
    applying etching liquid to the entirety of the surface of the masked GaN substrate, wherein the entirety of the main plane of the GaN substrate is unexposed to the etching liquid, thereby forming a crystallographic surface on the a-plane or m-plane that is exposed to the etching liquid and whichever is not the selected main plane.

2. The method according to claim 1, wherein KOH is used as the etching liquid.

3. A method of manufacturing a semiconductor laser diode, the method comprising:
    preparing a GaN substrate of which an a-plane or m-plane is selected as a main plane;
    masking the entirety of a surface of the main plane of the GaN substrate;
    applying etching liquid to the entirety of the surface of the masked GaN substrate, wherein the entirety of the main plane of the GaN substrate is unexposed to the etching liquid, thereby forming a crystallographic surface of the a-plane or m-plane, whichever is not the selected main plane;
    forming a GaN layer on the main plane of the GaN substrate;

forming a plurality of laser diode structures on the GaN layer;
etching the GaN substrate such that a cutting reference line is formed as a groove in the direction of the a-plane or m-plane, whichever is the selected main plane; and
cutting the GaN substrate along the cutting reference line so as to form a mirror surface of the semiconductor laser diode, the mirror surface coinciding with the cut surface of the a-plane or m-plane whichever is not the selected main plane.

4. The method according to claim 3, wherein the preparing of the GaN substrate includes the steps of:
preparing an r-plane sapphire substrate; and
forming an a-plane or m-plane GaN layer on the r-plane sapphire substrate.

5. The method according to claim 3, where the etching of the GaN substrate includes the steps of:
applying a mask onto the GaN substrate having laser diode structures formed thereon such that a region where the cutting reference line is to be formed is exposed.

6. The method according to claim 5, wherein the etching of the GaN substrate is performed using KOH etching liquid.

7. The method according to claim 3, wherein the cutting reference line is formed by etching only portion of the GaN substrate in the thickness direction of the GaN substrate.

8. The method according to claim 3, wherein the cutting reference line is formed by etching the GaN substrate such that the sapphire substrate is exposed.

* * * * *